(12) United States Patent
Chiang et al.

(10) Patent No.: US 8,273,256 B2
(45) Date of Patent: Sep. 25, 2012

(54) METHOD FOR MANUFACTURING WIRING STRUCTURE OF WIRING BOARD

(75) Inventors: Shu-Sheng Chiang, Taipei (TW); Tsung-Yuan Chen, Taoyuan County (TW); Wei-Ming Cheng, Kaohsiung (TW)

(73) Assignee: Unimicron Technology Corp., Taoyuan (TW)

( * ) Notice: Subject to any disclaimer, the term of this patent is extended or adjusted under 35 U.S.C. 154(b) by 250 days.

(21) Appl. No.: 12/793,560

(22) Filed: Jun. 3, 2010

(65) Prior Publication Data

US 2011/0147339 A1 Jun. 23, 2011

(30) Foreign Application Priority Data

Dec. 22, 2009 (TW) .............................. 98144179 A

(51) Int. Cl.
*H01L 13/00* (2006.01)
(52) U.S. Cl. ............... 216/19; 216/17; 216/18; 438/737
(58) Field of Classification Search .................... 216/13, 216/17, 18, 20, 58, 75, 77, 19; 438/424, 438/425, 737
See application file for complete search history.

(56) References Cited

U.S. PATENT DOCUMENTS

| 5,747,358 A * | 5/1998 | Gorrell et al. .................. 216/11 |
| 6,930,257 B1 | 8/2005 | Hiner et al. |
| 6,967,124 B1 | 11/2005 | Huemoeller et al. |
| 2004/0041264 A1 * | 3/2004 | Kloster et al. ................ 257/758 |
| 2005/0160575 A1 * | 7/2005 | Gambino et al. ............ 29/602.1 |

FOREIGN PATENT DOCUMENTS

| TW | 396568 B | 7/2000 |
| TW | 484203 B | 4/2002 |
| TW | 310599 Y | 5/2007 |

* cited by examiner

*Primary Examiner* — Lan Vinh
(74) *Attorney, Agent, or Firm* — Morris Manning & Martin LLP; Tim Tingkang Xia, Esq.

(57) ABSTRACT

A method for manufacturing a wiring structure of a wiring board is provided. In the method, a substrate including an insulation layer and a film disposed on the insulation layer is provided. Next, a barrier layer completely covering the film is formed. Next, an intaglio pattern partially exposing the insulation layer is formed on an outer surface of the barrier layer. Next, an activated layer is formed on the outer surface and in the intaglio pattern. Then, the activated layer on the outer surface is removed, and the activated layer in the intaglio pattern is remained. After the activated layer on the outer surface is removed, a conductive material is formed in the intaglio pattern by using a chemical deposition method. After forming the conductive material, the barrier layer and the film are removed.

17 Claims, 4 Drawing Sheets

METHOD FOR MANUFACTURING WIRING STRUCTURE OF WIRING BOARD

CROSS-REFERENCE TO RELATED APPLICATION

This application claims the benefit of Taiwan Patent Application No. 098144179, filed on Dec. 22, 2009, which is hereby incorporated by reference for all purposes as if fully set forth herein.

BACKGROUND OF THE INVENTION

1. Field of Invention

The present invention relates to a process of manufacturing a wiring board, and more particularly to a method for manufacturing a wiring structure of a wiring board.

2. Related Art

In a current technology for manufacturing a wiring board, a wiring structure of the wiring board is usually formed by using electroless plating or electroplating. Particularly, in a recent process of manufacturing the wiring structure, usually perform electroless plating at first, so as to form a seed layer and a chemical plating layer in sequence on a dielectric layer, wherein the seed layer and the chemical plating layer completely cover the surface of the dielectric layer.

Next, a patterned photoresist layer is formed on the chemical plating layer by using a lithography method, and the patterned photoresist layer partially exposes the chemical plating layer. Then, perform the electroplating, so as to form a plating metal layer on the chemical plating layer. Afterwards, perform an etching method and remove a portion of the chemical plating layer, so as to form a wiring layer. Thus, the wiring structure of the wiring board is completed.

SUMMARY OF THE INVENTION

The present invention is directed to a method for manufacturing a wiring structure of a wiring board.

The present invention provides a method for manufacturing a wiring structure of a wiring board. In the method, a substrate including an insulation layer and a film disposed on the insulation layer is provided, and the film completely covers the insulation layer. Next, a barrier layer completely covering the film is formed, and the barrier layer has an outer surface. Then, an intaglio pattern partially exposing the insulation layer is formed on the outer surface. Next, an activated layer is formed on the outer surface and in the intaglio pattern, and the activated layer completely covers the outer surface and all surfaces of the intaglio pattern. Next, the activated layer on the outer surface is removed, and the activated layer in the intaglio pattern is remained. After the activated layer on the outer surface is removed, a conductive material is formed in the intaglio pattern by using a chemical deposition method. The activated layer involves in chemical reactions of the chemical deposition method. After the conductive material is formed, the barrier layer and the film are removed.

In the present invention, the conductive material is formed in the intaglio pattern by using the activated layer remained in the intaglio pattern and the chemical deposition method. Thus, the wiring structure of the wiring board may be manufactured.

In order to make the aforementioned and other objectives, features and advantages of the present invention comprehensible, embodiments accompanied with figures are described in detail below.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1A:
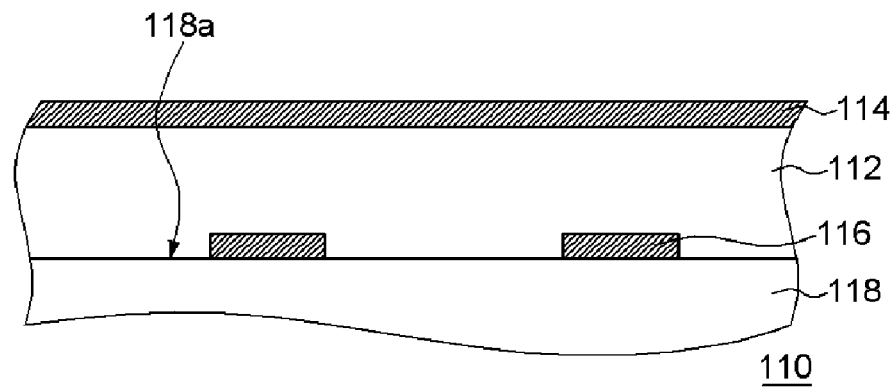
FIGS. 1A to 1G are schematic views illustrating processes of a method for manufacturing a wiring structure of a wiring board according to an embodiment of the present invention.

FIGS. 1A to 1G are schematic views illustrating processes of a method for manufacturing a wiring structure of a wiring board according to an embodiment of the present invention. Referring to FIG. 1A, in the method for manufacturing a wiring structure of a wiring board of this embodiment, firstly a substrate 110 is provided. The substrate 110 includes an insulation layer 112 and a film 114. The film 114 is disposed on the insulation layer 112, and completely covers the insulation layer 112.

The film 114 may be a metal layer, and the material of the metal layer is such as copper, nickel, chromium, aluminum, or other metal materials. The insulation layer 112 may be formed by curing a prepreg under high temperature and high pressure, and the material of the insulation layer 112 may be a film mixed with resin and glass fiber. In addition, the insulation layer 112 may also be a polymer material layer, and a material thereof is, for example, polyimide (PI), liquid crystal polymer (LCP), or ajinomoto build-up film (ABF).

When the film 114 is a metal layer, a method for forming the substrate 110 is depositing the metal layer (that is, the film 114) on the insulation layer 112, and a method for depositing the metal layer may be a sputtering or an electroless plating. In addition, the method for forming the substrate 110 is laminating a metal foil on the insulation layer 112, and the metal foil is, for example, a copper foil or a resin coated copper foil. Accordingly, after the metal foil is laminated, a thickness of the metal foil is reduced, so as to form the film 114. A method for reducing the thickness of the metal foil is, for example, etching the metal foil, so as to remove a portion of the metal foil, thereby reducing the thickness of the metal foil. The etching method is, for example, wet etching.

In this embodiment, the substrate 110 may further include a wiring layer 116 and an inner wiring substrate 118. The wiring layer 116 is located on a position opposite to the film 114 and electrically connected to the inner wiring substrate 118. Both the insulation layer 112 and the wiring layer 116 are disposed on the inner wiring substrate 118, and the insulation layer 112 covers the wiring layer 116 and a surface 118a of the inner wiring substrate 118.

The inside of the inner wiring substrate 118 exists at least one wiring layer (not shown), that is, the inner wiring substrate 118 may be substantially considered as a wiring board, and in a subsequent manufacturing process, a wiring layer is formed on the insulation layer 112. Thus the method for manufacturing the wiring structure of this embodiment may be applied to manufacturing a multilayer wiring board.

In other not shown embodiments, the wiring layer 116 and the inner wiring substrate 118 are selective elements and not necessary elements, that is, the substrate 110 not necessarily includes the wiring layer 116 and the inner wiring substrate 118, and the method for manufacturing the wiring structure of this embodiment may also be applied to manufacturing a single-side wiring board or a double-side wiring board.

In detail, when the substrate 110 includes the wiring layer 116, but not includes the inner wiring substrate 118, the method for manufacturing the wiring structure of this embodiment may be applied to manufacturing the double-side wiring board. When the substrate 110 does not include the wiring layer 116 and the inner wiring substrate 118, the method for manufacturing the wiring structure of this embodiment may be applied to manufacturing the single-side wiring board.

Figure 1B:
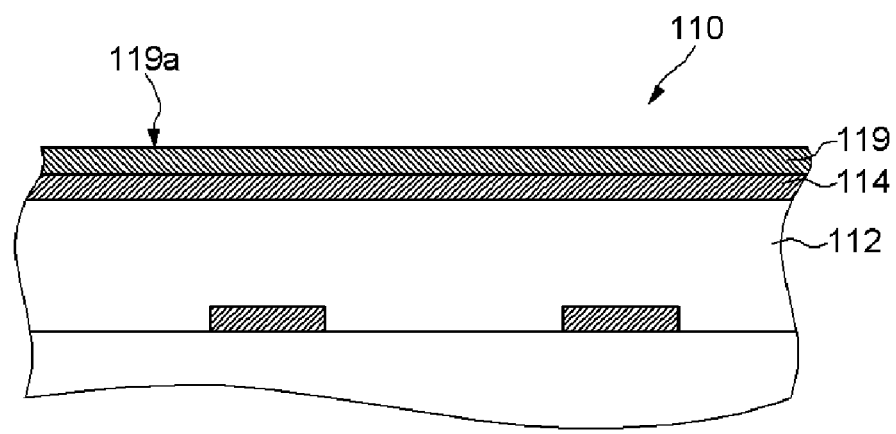

Referring to FIG. 1B, next, a barrier layer 119 is formed on the film 114. The barrier layer 119 completely covers the film 114 and has an outer surface 119a. The barrier layer 119 may be a metal layer or a non-metal layer, and the material of the non-metal layer is, for example, a polymer material or a ceramic material.

When both the barrier layer 119 and the film 114 are metal layers, the materials of the barrier layer 119 and the film 114 are copper, nickel, chromium, aluminum, or other metal materials, but the materials of the barrier layer 119 and the film 114 may be different, for example, the barrier layer 119 is a chromium metal layer, but the film 114 is a copper metal layer. In addition, a method for forming the barrier layer 119 is depositing the metal layer (that is, the barrier layer 119) on the film 114, and the method for depositing the metal layer may be a sputtering, an electroplating method, or an electroless plating.

Figure 1C:
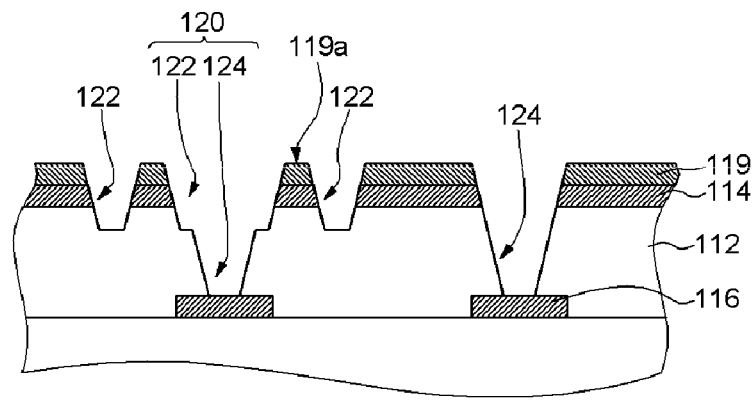

Referring to FIGS. 1B and 1C, next, an intaglio pattern 120 is formed on an outer surface 119a of the barrier layer 119. The intaglio pattern 120 partially exposes the insulation layer 112, such that the intaglio pattern 120 is formed by removing a portion of the barrier layer 119, a portion of the film 114, and a portion of the insulation layer 112. In addition, a method for forming the intaglio pattern 120 may perform laser ablation or plasma etching to the substrate 110.

In FIG. 1C, the intaglio pattern 120 may include a plurality of trenches 122 partially exposing the insulation layer 112 and a plurality of blind vias 124. At least one blind via 124 is located under one of the trenches 122 and communicates with the trench 122. In addition, in other not shown embodiments, the number of the blind via 124 of the intaglio pattern 120 may be only one. Therefore, the number of the blind vias 124 as shown in FIG. 1C is only used for an exemplary description without limiting the present invention.

In the process of forming the intaglio pattern 120, first, the trenches 122 are formed on the outer surface 119a of the barrier layer 119, and the trenches 122 are formed by such as laser ablation or plasma etching. Next, the blind vias 124 partially exposing the wiring layer 114 are formed. A method for forming the blind vias 124 may perform mechanical drilling, laser drilling, or plasma etching to the substrate 110.

It should be noted that in other not shown embodiments, the intaglio pattern 120 may only include the trenches 122 or the blind vias 124, that is, the intaglio pattern 120 only includes the trenches 122, but not includes any blind via 124, or the intaglio pattern 120 only includes at least one blind via 124, but not includes any trench 122. Therefore, the intaglio pattern 120 as shown in FIG. 1C is only used for an exemplary description without limiting the present invention.

Figure 1D:
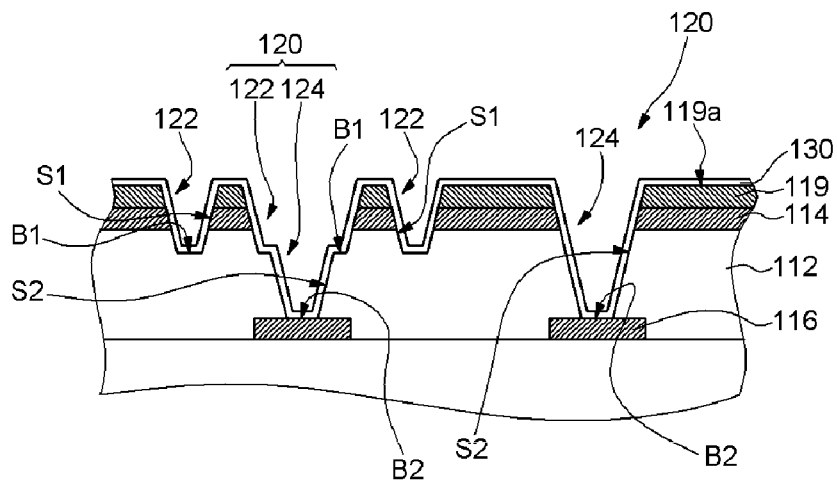

Referring to FIG. 1D, next, an activated layer 130 is formed on the outer surface 119a and in the intaglio pattern 120. The activated layer 130 completely covers the outer surface 119a and all surfaces of the intaglio pattern 120. In detail, taking FIG. 1D as an example, the activated layer 130 not only completely covers the outer surface 119a, but also completely covers bottoms B1 and side walls S1 of the trenches 122, and bottoms B2 and side walls S2 of the blind vias 124. That is, the activated layer 130 also partially covers the wiring layer 116.

A method for forming the activated layer 130 has many implementation means. In this embodiment, the method for forming the activated layer 130 includes dipping the barrier layer 119 and the insulation layer 112 into an ionic solution (not shown). The ionic solution contains a plurality of metal ions, and the metal ions may be, for example, nickel ions, palladium ions, platinum ions, chromium ions, silver ions, or molybdenum ions.

In this embodiment, when the barrier layer 119 and the insulation layer 112 are dipped into the ionic solution, the barrier layer 119, the film 114, the insulation layer 112, and the wiring layer 116 exposed in the intaglio pattern 120 are all in contact with the ionic solution, such that the metal ions are adsorbed to the barrier layer 119, the film 114, the insulation layer 112, and the wiring layer 116, so as to form the activated layer 130. Therefore, the activated layer 130 is in contacts with the barrier layer 119, the film 114, the insulation layer 112, and the wiring layer 116.

In detail, when the ionic solution is in contacts with the barrier layer 119, the film 114, the insulation layer 112, and the wiring layer 116, the metal ions are converted into chelates, and the chelates converted from the metal ions may be adsorbed on the outer surface 119a and all the surfaces of the intaglio pattern 120. The adsorption strengths between the metal ions and the film 114, the barrier layer 119, and the wiring layer 116 are smaller than the adsorption strength between the metal ions and the insulation layer 112. In other words, the activated layer 130 is easily removed from the film 114, the barrier layer 119, and the wiring layer 116, but is difficultly removed from the insulation layer 112.

Figure 1E:
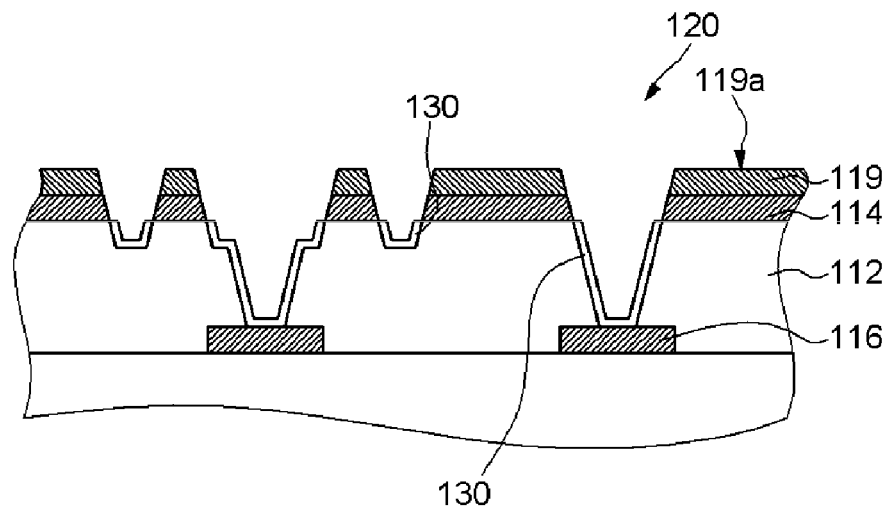

Referring to FIGS. 1D and 1E, next, the activated layer 130 on the outer surface 119a is removed, so as to expose the barrier layer 119 and the wiring layer 116 and remain the activated layer 130 in the intaglio pattern 120. A method for removing the activated layer 130 on the outer surface 119a may perform etching, for example, wet etching. In this embodiment, the activated layer 130 in contact with the insulation layer 112 is remained.

Particularly, when the activated layer 130 on the outer surface 119a is removed through etching, since the activated layer 130 is easily removed from the film 114, the barrier layer 119, and the wiring layer 116, but is difficultly removed from the insulation layer 112, the activated layer 130 in contact with the film 114, the barrier layer 119, and the wiring layer 116 is etched, and the activated layer 130 in contact with the insulation layer 112 is remained.

Figure 1F:
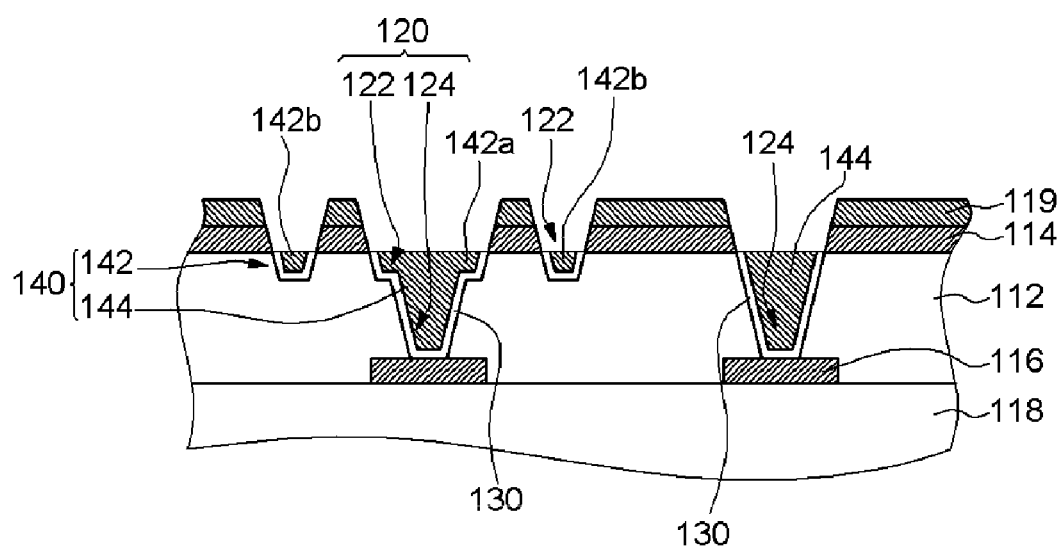

Referring to FIG. 1F, next, a conductive material 140 is formed in the intaglio pattern 120 by using a chemical deposition method. The activated layer 130 involves in chemical reactions of the chemical deposition method, that is, the conductive material 140 is formed through the chemical reactions of the activated layer 130, so the chemical deposition method limits where the conductive material 140 is formed, so as to enable the conductive material 140 to form on the activated layer 130 only. In addition, the materials of the conductive material 140 and the film 114 may be the same, for example, copper, nickel, chromium, aluminum, or other metal materials.

The chemical deposition method may be chemical vapor deposition (CVD) or an electroless plating. Alternatively, the chemical deposition method may include an electroless plating and an electroplating. When the chemical deposition method includes the electroless plating and the electroplating, the process of forming the conductive material 140 may perform the electroless plating and the electroplating in sequence. After electroless plating and electroplating, if the barrier layer 119 is the metal layer, not only the conductive material 140 is formed, but also a plating metal layer (not shown) is deposited on the barrier layer 119, in which the materials of the plating metal layer and the conductive material 140 are the same.

In the process of forming the conductive material 140, a patterned conductive layer 142 may be formed in the trenches 122, and conductive posts 144 may be formed in the blind vias 124. The patterned conductive layer 142 is a wiring layer. That is to say, the patterned conductive layer 142 includes a bonding pad 142a and a plurality of traces 142b. Therefore, the conductive material 140 may include the patterned conductive layer 142 and at least one conductive post 144.

Accordingly, the conductive posts 144 are electrically connected between the patterned conductive layer 142 and the wiring layer 116. For example, at least one conductive post 144 is located under one of the bonding pads 142a, and is connected to the bonding pad 142a, such that the patterned conductive layer 142 is electrically connected to the inner wiring substrate 118 through the conductive posts 144 and the wiring layer 116. In addition, the blind vias 124 are filled with the conductive posts 144. However, in other not shown embodiments, the blind vias 124 may also not be filled with the conductive posts 144, such that the conductive posts 144 as shown in FIG. 1F do not limit the present invention.

It should be noted that in other not shown embodiment, the intaglio pattern 120 may only include the trenches 122 or the blind vias 124, so in the process of forming the conductive material 140, only the conductive posts 144 or only the patterned conductive layer 142 may be formed. Therefore, the conductive material 140 as shown in FIG. 1F is only used for an exemplary description without limiting the present invention.

In detail, when the intaglio pattern 120 only includes the blind vias 124, but not includes any trench 122, in this embodiment, only the conductive posts 144 are formed, but no patterned conductive layer 142 is formed. When the intaglio pattern 120 only includes the trench 122, but not includes any blind via 124, in this embodiment, only the patterned conductive layer 142 is formed, but no conductive post 144 is formed.

Figure 1G:
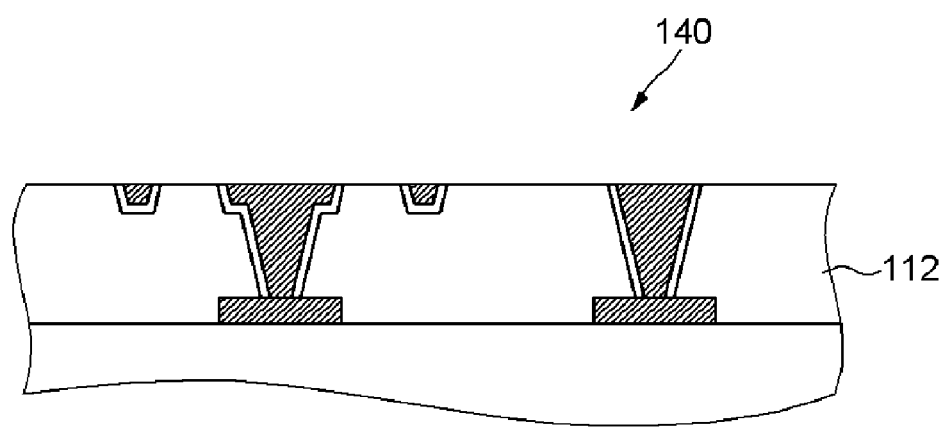

Referring to FIGS. 1F and 1G, after forming the conductive material 140, the barrier layer 119 and the film 114 are removed. The method for removing the barrier layer 119 and the film 114 may perform etching, for example, the wet etching. The wiring structure of the wiring board including the conductive material 140 and the insulation layer 112 is basically manufactured so far.

In addition, when conductive material 140 is formed by using the electroless plating and the electroplating, and the materials of the conductive material 140 and the film 114 are the same, the plating metal layer deposited on the barrier layer 119 may also be removed together with the film 114 through etching (for example, wet etching). That is to say, the plating metal layer and the film 114 may be removed in the same etchant.

In summary, in the present invention, the conductive material is formed in the intaglio pattern by using the activated layer remained in the intaglio pattern and the chemical deposition method, so as to manufacture the wiring structure including the wiring layer (that is, the patterned conductive layer) or the conductive posts. As compared with the conventional method for manufacturing the wiring structure of the wiring board, the present invention may manufacture the wiring structure without forming the patterned photoresist layer, and a lithography process may be omitted as well.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a wiring structure of a wiring board, comprising:
   providing a substrate comprising an insulation layer and a film disposed on the insulation layer, wherein the film completely covers the insulation layer;
   forming a barrier layer completely covering the film, wherein the barrier layer has an outer surface;
   forming an intaglio pattern partially exposing the insulation layer on the outer surface;
   forming an activated layer on the outer surface and in the intaglio pattern, wherein the activated layer completely covers the outer surface and all surfaces of the intaglio pattern;
   removing the activated layer on the outer surface, and remaining the activated layer in the intaglio pattern;
   forming a conductive material in the intaglio pattern by using a chemical deposition method after removing the activated layer on the outer surface, wherein the activated layer involves in chemical reactions of the chemical deposition method; and
   removing the barrier layer and the film after forming the conductive material,
   wherein the barrier layer is a metal layer, and a method for forming the barrier layer comprises depositing the metal layer on the film.

2. The method for manufacturing a wiring structure of a wiring board according to claim 1, wherein the chemical deposition method is a chemical vapor deposition (CVD).

3. The method for manufacturing a wiring structure of a wiring board according to claim 1, wherein a method for removing the activated layer on the outer surface is an etching.

4. The method for manufacturing a wiring structure of a wiring board according to claim 1, wherein a method for removing the barrier layer and the film is an etching.

5. The method for manufacturing a wiring structure of a wiring board according to claim 1, wherein the film is a metal layer, and a method for forming the substrate comprises depositing the metal layer on the insulation layer.

6. The method for manufacturing a wiring structure of a wiring board according to claim 1, wherein a method for forming the substrate comprises:
   laminating a metal foil on the insulation layer; and
   reducing a thickness of the metal foil, after laminating the metal foil.

7. The method for manufacturing a wiring structure of a wiring board according to claim 1, wherein a method for forming the intaglio pattern comprises performing laser ablation or plasma etching to the substrate.

8. The method for manufacturing a wiring structure of a wiring board according to claim 1, wherein the process of forming the intaglio pattern comprises forming a plurality of trenches partially exposing the insulation layer on the outer surface.

9. The method for manufacturing a wiring structure of a wiring board according to claim 1, wherein the chemical deposition method comprises an electroless plating.

10. The method for manufacturing a wiring structure of a wiring board according to claim 9, wherein the chemical deposition method further comprises an electroplating.

11. The method for manufacturing a wiring structure of a wiring board according to claim 1, wherein a method for forming the activated layer comprises dipping the barrier layer and the insulation layer into an ionic solution containing a plurality of metal ions.

12. The method for manufacturing a wiring structure of a wiring board according to claim 11, wherein the metal ions are nickel ions, palladium ions, platinum ions, chromium ions, silver ions, or molybdenum ions.

13. The method for manufacturing a wiring structure of a wiring board according to claim 1, wherein the substrate further comprises a wiring layer, the wiring layer is located on a position opposite to the film, and the insulation layer covers the wiring layer.

14. The method for manufacturing a wiring structure of a wiring board according to claim 13, wherein the substrate further comprises an inner wiring substrate, both the insulation layer and the wiring layer are disposed on the inner wiring substrate, and the wiring layer is electrically connected to the inner wiring substrate.

15. The method for manufacturing a wiring structure of a wiring board according to claim 13, wherein the process of forming the intaglio pattern comprises forming at least one blind via partially exposing the wiring layer.

16. The method for manufacturing a wiring structure of a wiring board according to claim 15, wherein the process of forming the conductive material comprises forming a conductive post in the blind via.

17. The method for manufacturing a wiring structure of a wiring board according to claim 16, wherein the blind via is filled with the conductive post.

* * * * *